(12) United States Patent
Mohammed et al.

(10) Patent No.: US 9,390,998 B2
(45) Date of Patent: Jul. 12, 2016

(54) HEAT SPREADING SUBSTRATE

(75) Inventors: Ilyas Mohammed, Santa Clara, CA (US); Liang Wang, Milpitas, CA (US); Gabriel Z. Guevara, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 1183 days.

(21) Appl. No.: 13/399,952

(22) Filed: Feb. 17, 2012

(65) Prior Publication Data

US 2013/0215121 A1    Aug. 22, 2013

(51) Int. Cl.
*H01L 23/62* (2006.01)
*H01L 23/373* (2006.01)

(52) U.S. Cl.
CPC ..... *H01L 23/3735* (2013.01); *H01L 2924/0002* (2013.01)

(58) Field of Classification Search
CPC ... H01L 23/13; H01L 23/142; H01L 23/3672; H01L 23/49811; H01L 29/66431; H01L 29/778
USPC ............................ 257/720, 723, 737, E21.001
See application file for complete search history.

(56) References Cited

U.S. PATENT DOCUMENTS

| | | | | |
|---|---|---|---|---|
| 5,371,654 A * | 12/1994 | Beaman | ............ | G01R 1/07307 174/16.3 |
| 8,785,961 B2 * | 7/2014 | Guevara | ................. | H01L 23/36 257/79 |
| 9,087,854 B1 * | 7/2015 | Ha | ..................... | H01L 29/66431 |
| 2005/0006754 A1 * | 1/2005 | Arik | ....................... | B82Y 10/00 257/712 |
| 2005/0228097 A1 * | 10/2005 | Zhong | .................... | B82Y 30/00 524/430 |
| 2005/0280142 A1 * | 12/2005 | Hua | ........................ | H01L 23/10 257/707 |
| 2007/0090522 A1 * | 4/2007 | Alhayek | ............. | H01L 23/3677 257/723 |
| 2007/0205495 A1 * | 9/2007 | Fernandez | .......... | H01L 23/3128 257/686 |
| 2007/0216274 A1 * | 9/2007 | Schultz | ................ | H05K 1/0204 313/46 |
| 2008/0239675 A1 * | 10/2008 | Speier | ..................... | H01L 23/13 361/712 |
| 2009/0309215 A1 * | 12/2009 | Kitabatake | ........... | H01L 23/3672 257/720 |
| 2010/0319898 A1 * | 12/2010 | Underwood | .......... | H01L 23/373 165/185 |
| 2013/0004791 A1 * | 1/2013 | Suzuki | ................... | C04B 37/021 428/621 |
| 2014/0035129 A1 * | 2/2014 | Stuber | ................ | H01L 23/49811 257/737 |

* cited by examiner

*Primary Examiner* — Michael Lebentritt
(74) *Attorney, Agent, or Firm* — Forefront IP Lawgroup, PLLC

(57) ABSTRACT

Heat spreading substrate. In accordance with an embodiment of the present invention, an apparatus includes a thermally conductive, electrically insulating regular solid, a first electrically conductive coating mechanically coupled to a first edge of the regular solid and a second electrically conductive coating mechanically coupled to a second edge of the regular solid. The first and the second electrically conductive coatings are electrically isolated from one another and the faces of the first electrically conductive coating, the second electrically conductive coating and the regular solid are substantially co-planar. The primary and secondary surfaces of the regular solid may be free of electrically conductive materials.

25 Claims, 16 Drawing Sheets

500

- 510 Lay down layer of conductive material
- 515 Place a layer of insulating material on the layer of conductive material
- 520 Place a highly thermally conductive material on the layer of insulating material
- 525 Place a layer of insulating material on the highly thermally conductive material
- 530 Place a layer of conductive material on the layer of insulating material
- 535 Slice layup of all layers
- 540 Apply electrical contact layer to the top of the layers of conductive material
- 545 Place a thermally conductive pad on top of the thermally conductive material
- 550 Place insulating tape on bottom of the layer stack
- 555 Mount electronic devices to heat spreaing substrate
- 560 Attach solder balls to underside of conductive layers
- 599 Singulate mounted electronic devices ( Finish )

Figure 5

HEAT SPREADING SUBSTRATE

FIELD OF INVENTION

Embodiments of the present invention relate to the field of integrated circuit design and manufacture. More specifically, embodiments of the present invention relate to systems and methods for a heat spreading substrate.

BACKGROUND

A variety of semiconductor devices, for example, light emitting diodes (LED), radio frequency (RF) devices, motor controllers, power semiconductors and the like, may be characterized as having high power density. For example, many LED devices may be said to run "hot." In addition, the substrates of many such devices, e.g., comprising sapphire or Gallium arsenide (GaAs) are not good conductors of heat. Conventional mounting and heat sinking methods and structures do not cost effectively remove the heat generated by such devices.

SUMMARY OF THE INVENTION

Therefore, what is needed are systems and methods for heat spreading substrates. What is additionally needed are systems and methods for heat spreading substrates comprising rolled materials. A further need exists for systems and methods for heat spreading substrates that are compatible and complementary with existing systems and methods of integrated circuit design, manufacturing and test. Embodiments of the present invention provide these advantages.

In a first embodiment in accordance with the present invention, an apparatus includes a first conductive layer, a first insulating layer disposed in contact with the first conductive layer and a thermally conductive layer disposed in contact with the first insulating layer, opposite the first conductive layer. The faces of the first conductive layer, the first insulating layer and the thermally conductive layer are substantially co-planar; and a sum of widths of faces of the first conductive layer, the first insulating layer and the thermally conductive layer is greater than a height of the faces. The first conductive layer and the first insulating layer may include rolled materials.

In accordance with embodiments of the present invention, a thickness of each of the first and electrically conductive coatings, the first and second insulating coatings and the regular solid may be substantially constant. In accordance with embodiments of the present invention, the thermally and electrically conducting regular solid may be configured for mounting a body of an electronic device. In accordance with embodiments of the present invention, the first electrically conductive coating and the second electrically conductive coating may be configured for making electrical contact with contacts of an electronic device. In accordance with embodiments of the present invention, the first electrically conductive coating and the second electrically conductive coating may be configured for conducting electrical signals to the contacts of an electronic device. In accordance with embodiments of the present invention, a plurality of electronic devices may be wire bonded to the first electrically conductive coating. In accordance with embodiments of the present invention, a plurality of electronic devices may be surface mounted to the first electrically conductive coating.

In accordance with embodiments of the present invention, an apparatus includes a light emitting diode. In accordance with embodiments of the present invention, an apparatus includes a base for coupling to an alternating current supply, and electronics configured to convert the alternating current to electrical power suitable for driving the light emitting diode. In accordance with embodiments of the present invention, an apparatus includes at least two light emitting diodes mounted on the same the thermally and electrically conducting regular solid.

In accordance with embodiments of the present invention, an apparatus includes a processor for operating a graphical user interface, and a display for displaying the graphical user interface. The light emitting diode may be configured to illuminate the display.

In accordance with another embodiment of the present invention, an apparatus includes a first conductive layer, a first insulating layer disposed in contact with the first conductive layer and a thermally conductive layer disposed in contact with the first insulating layer, opposite the first conductive layer. The apparatus further includes a second insulating layer disposed in contact with the thermally conductive layer, opposite the first insulating layer, a second conductive layer disposed in contact with the second insulating layer, opposite the thermally conductive layer. The faces of the first conductive layer, the first insulating layer and the thermally conductive layer are substantially co-planar, and a sum of widths of faces of the first conductive layer, the first insulating layer and the thermally conductive layer is greater than a height of the faces.

In accordance with a method embodiment of the present invention, a first layer of insulating material is placed on a first layer of conductive material. A layer of thermally conductive material is placed on the first layer of insulating material, opposite the first layer of conductive material, wherein all materials mechanically adhere to one another. All layers are sliced substantially parallel to a long axis of the materials to form a heat spreading substrate. A sum of widths of faces of the first conductive layer, the first insulating layer and the thermally conductive layer is greater than a height of the faces.

In accordance with a method embodiment of the present invention, a layer of thermally conductive material may be pulled from a roll of thermally conductive material. In accordance with a method embodiment of the present invention, a plurality of electronic devices may be mounted on a primary surface of the heat spreading substrate, making electrical contact with the first conductive layer and the second conductive layer. In accordance with a method embodiment of the present invention, a solder ball may be attached to the underside of the first conductive layer. In accordance with a method embodiment of the present invention, one electronic device may be singulated from a plurality of electronic devices.

In accordance with still another embodiment of the present invention, an apparatus includes a thermally conductive, electrically insulating regular solid, a first electrically conductive coating mechanically coupled to a first edge of the regular solid and a second electrically conductive coating mechanically coupled to a second edge of the regular solid. The first and the second electrically conductive coatings are electrically isolated from one another and the faces of the first electrically conductive coating, the second electrically conductive coating and the regular solid are substantially co-planar. The primary and secondary surfaces of the regular solid may be free of electrically conductive materials.

In accordance with another embodiment of the present invention, the first electrically conductive coating and the second electrically conductive coating may be configured for making electrical contact with contacts of an electronic device. In accordance with another embodiment of the present invention, the first electrically conductive coating and the second electrically conductive coating may be configured for conducting electrical signals to the contacts of an electronic device. In accordance with another embodiment of the present invention, a plurality of electronic devices may be wire bonded to the first electrically conductive coating. In accordance with another embodiment of the present invention, a plurality of electronic devices may be surface mounted to the first electrically conductive coating.

In accordance with another embodiment of the present invention, an apparatus includes a light emitting diode. In accordance with another embodiment of the present invention, an apparatus includes a base for coupling to an alternating current supply, and electronics configured to convert the alternating current to electrical power suitable for driving the light emitting diode. In accordance with another embodiment of the present invention, an apparatus includes a processor for operating a graphical user interface, and a display for displaying the graphical user interface. The light emitting diode may be configured to illuminate the display.

In accordance with another method embodiment of the present invention, a thermally conductive, electrically insulating regular solid is coated with an electrically conductive coating. Portions of the electrically conductive coating are removed from primary and secondary surfaces of the thermally conductive, electrically insulating the regular solid. Portions of the electrically conductive coating are removed from faces of the thermally conductive, electrically insulating regular solid, forming first and second electrically conductive coating on edges of the thermally conductive, electrically insulating regular solid. The first and the second electrically conductive coatings are electrically isolated from one another. A plurality of electronic devices may be mounted on a primary surface of the thermally conductive, electrically insulating regular solid, making electrical contact with the first and the second electrically conductive coatings.

In accordance with another embodiment of the present invention, a method includes wire bonding and/or surface mounting a plurality of electronic devices to a thermally conductive, electrically insulating regular solid. In accordance with another embodiment of the present invention, a method includes attaching a solder ball to the underside of the first electrically conductive coating. In accordance with another embodiment of the present invention, a method includes singulating one electronic device from a plurality of electronic devices.

In accordance with yet another embodiment of the present invention, an apparatus includes a thermally and electrically conducting regular solid, a first insulating coating mechanically coupled to a first edge of the regular solid a first electrically conductive coating mechanically coupled to the first insulating coating, a second insulating coating mechanically coupled to a second edge of the regular solid, and a second electrically conductive coating mechanically coupled to the second insulating coating. The first and the second electrically conductive coatings are electrically isolated from one another, and the faces of the first and electrically conductive coatings, the first and second insulating coatings and the regular solid are substantially co-planar.

In accordance with another embodiment of the present invention, the thermally and electrically conducting regular solid may be configured for mounting a body of an electronic device. In accordance with another embodiment of the present invention, the first electrically conductive coating and the second electrically conductive coating are configured for making electrical contact with contacts of an electronic device. In accordance with another embodiment of the present invention, the first electrically conductive coating and the second electrically conductive coating are configured for conducting electrical signals to the contacts of an electronic device. In accordance with another embodiment of the present invention, the thermally and electrically conducting regular solid may be configured for making electrical contact with contacts of an electronic device. In accordance with another embodiment of the present invention, a plurality of electronic devices may be wire bonded to the first electrically conductive coating. In accordance with another embodiment of the present invention, a plurality of electronic devices may be surface mounted to the first electrically conductive coating.

In accordance with another embodiment of the present invention, a plurality of electronic devices includes a light emitting diode. In accordance with another embodiment of the present invention, an apparatus includes a base for coupling to an alternating current supply, and electronics configured to convert the alternating current to electrical power suitable for driving the light emitting diode. In accordance with another embodiment of the present invention, an apparatus includes at least two light emitting diodes mounted on the same the thermally and electrically conducting regular solid. In accordance with another embodiment of the present invention, an apparatus includes a processor for operating a graphical user interface, a display for displaying the graphical user interface. A light emitting diode may be configured to illuminate the display.

In accordance with still another method embodiment of the present invention, a thermally and electrically conducting regular solid is first coated with an electrically insulating coating to produce an insulation-covered solid body. The insulation-covered solid body is second coated with an electrically conductive coating. Portions of the electrically conductive coating are removed from primary and secondary surfaces of the thermally and electrically conducting regular solid. Portions of the electrically conductive coating are removed from primary and secondary surfaces of the thermally and electrically conducting regular solid. Portions of the electrically conductive coating are removed from faces of the thermally and electrically conducting regular solid, forming first and second electrically conductive coating on edges of the thermally and electrically conducting regular solid. The first and the second electrically conductive coatings are electrically isolated from one another.

In accordance with another embodiment of the present invention, a method includes mounting a plurality of electronic devices on a primary surface of the thermally and electrically conducting regular solid, making electrical contact with the first electrically conductive coating. In accordance with another embodiment of the present invention, a method includes mounting a plurality of electronic devices on a primary surface of the thermally and electrically conducting regular solid, making electrical contact with the thermally and electrically conducting regular solid. In accordance with another embodiment of the present invention, a method includes attaching a solder ball to the underside of the first electrically conductive coating.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

FIG. 5 illustrates a method, in accordance with embodiments of the present invention.

DETAILED DESCRIPTION

Figure 1:
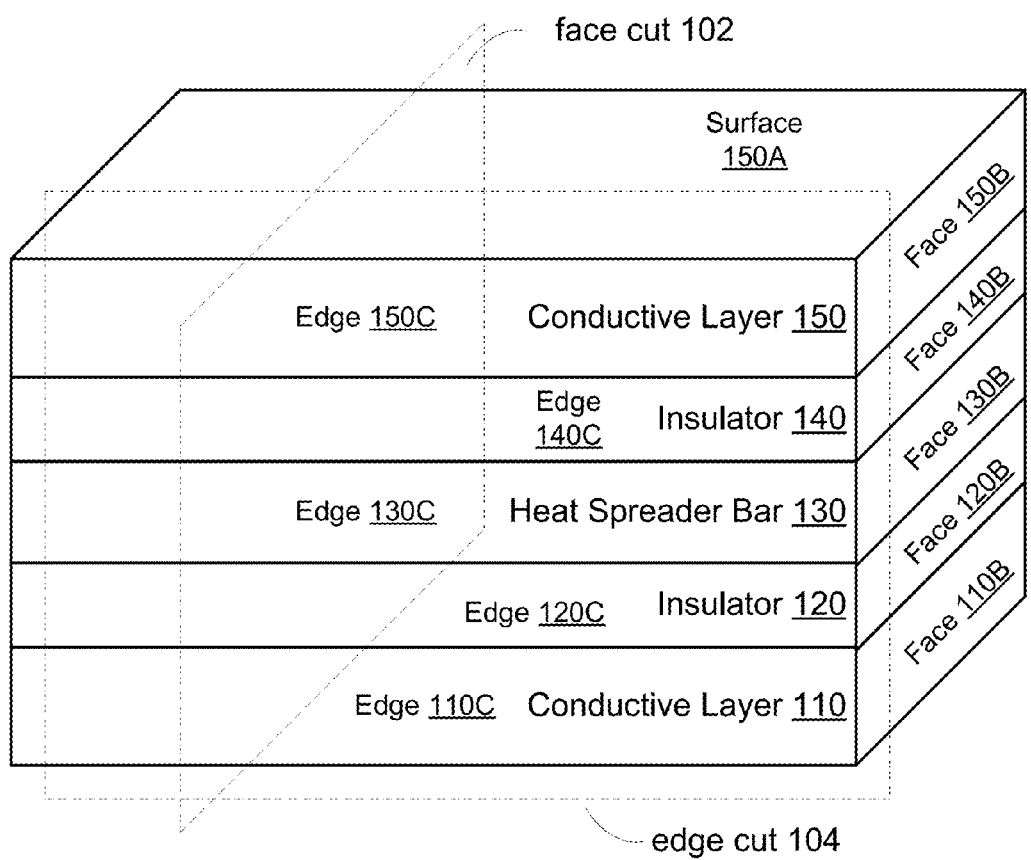
FIG. 1 illustrates a perspective view of a heat spreading substrate, in accordance with embodiments of the present invention.

Reference will now be made in detail to various embodiments of the invention, front facing piggyback wafer assembly, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., process 500) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "attaching" or "processing" or "singulating" or "coating" or "placing" or "slicing" or "forming" or "mounting" or "applying" or "roughening" or "filling" or "accessing" or "performing" or "generating" or "adjusting" or "creating" or "executing" or "continuing" or "indexing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The term sheet, generally and herein, refers to or describes a three-dimensional solid, in which the length and width dimensions are significantly larger than the thickness dimension. For example, a sheet of paper. The term strip, generally and herein, refers to or describes a three-dimensional solid, in which the length and width dimensions are significantly larger than the thickness dimension. In addition, the length of a strip is generally much larger than its width. For example, a sheet may be cut into multiple strips, e.g., with cuts along a long dimension.

Heat Spreading Substrate

FIG. 1 illustrates a perspective view of a heat spreading substrate 100, in accordance with embodiments of the present invention. Conductive layer 110 comprises a sheet or strip of a conductive material, e.g., Aluminum (Al). Other conductive materials, including, for example, Copper (Cu), metal powders, particle filled materials, Silicon, metal-filled epoxy, carbon, composite materials and the like may also be used in the formation of conductive layer 110. Conductive layer 110 comprises two surfaces (not shown), a face 110B and an edge 110C. Conductive layer 110 further comprises a second face and a second edge, obscured in the perspective of FIG. 1 and not shown.

Heat spreading substrate 100 also comprises a heat spreader bar 130. Heat spreader bar 130 comprises a sheet or strip of thermally conductive material, of approximately the same length and width as conductive layer 110. Heat spreader bar 130 comprises two surfaces (not shown), a face 130B and an edge 130C. Heat spreader bar 130 further comprises a second face and a second edge, obscured in the perspective of FIG. 1 and not shown. Heat spreader bar 130 should be characterized as having a high thermal conductivity, e.g., having a thermal conductivity greater than that of sapphire ($\alpha$-$Al_2O_3$), 32 or 35 $W \cdot m^{-1} \cdot K^{-1}$, depending on the orientation. Heat spreader bar 130 may be further characterized as having a low coefficient of thermal expansion, e.g., having a coefficient of thermal expansion ($\alpha$) less than that of Aluminum, 23 $10^{-6}$/° C.

In some embodiments, heat spreader bar 130 is further characterized as having a low linear coefficient of thermal expansion ($\alpha$), while in other embodiments, heat spreader bar 130 is characterized as having a low volumetric coefficient of thermal expansion, e.g., having a volumetric coefficient of thermal expansion ($\beta$) less than that of Aluminum, 69 $10^{-6}/°$C. Still other embodiments may be characterized as having low linear and low volumetric coefficients of thermal expansion for heat spreader bar 130. Heat spreader bar 130 may comprise Copper (Cu), particle filled materials, Silver (Ag) doped epoxy, Aluminum (Al), Silicon carbide (SiC) and/or ceramics, for example. In accordance with embodiments of the present invention, heat spreader bar 130 may be electrically conductive or an electrical insulator.

Heat spreading substrate 100 further comprises an insulator 120. Insulator 120 comprises a sheet or strip of insulating material, of approximately the same length and width as conductive layer 110. Insulator 120 comprises two surfaces (not shown), a face 120B and an edge 120C. Insulator 120 further comprises a second face and a second edge, obscured in the perspective of FIG. 1 and not shown. Insulator 120 provides electrical isolation between conductive layer 110 and heat spreader bar 130. Insulator 120 may also provide mechanical adhesion or bonding between conductive layer 110 and heat spreader bar 130. Insulator 120 should remain electrically and mechanically functional at operating temperatures of heat spreading substrate 100. Insulator 120 may comprise a polyimide tape and/or poly(methyl methacrylate) (PMMA), for example.

Heat spreading substrate 100 may optionally also comprise insulator 140, having a face 140B and an edge 140C, which is similar to insulator 120 in dimension, composition and function, and conductive layer 150, having a face 150B, edge 150C and surface 150A, which is similar to conductive layer 110 in dimension, composition and function.

It is to be appreciated that insulators 120 and 140 may not be present if heat spreader bar 130 is an electrical insulator, in accordance with embodiments of the present invention. However, insulators 120 and 140 may be utilized for other mechanical properties, including, for example, adhesion, shock absorption, compliance with thermal expansion of other layers, and the like.

It is to be appreciated that the thickness of layers 110, 120, 130, 140 and/or 150 will vary according to the material properties of that layer and its function within heat spreading substrate 100, as further described below. In general, the thickness of layers 110, 120, 130, 140 and/or 150 may vary from a few mils (thousandths of an inch) to a few millimeters. In general, the thicknesses of conductive layer 110, insulator 120 and heat spreader bar 130 may be different. In accordance with embodiments of the present invention, layers 110, 120, 130, 140 and/or 150 may comprise rolled materials.

Figure 2:
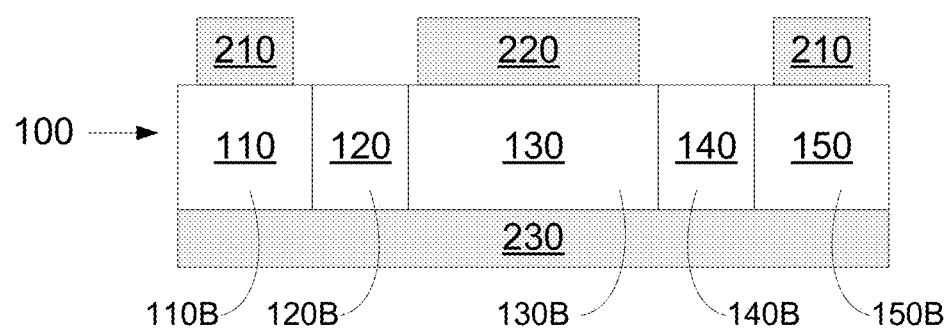
FIG. 2 illustrates a side sectional view of a heat spreading substrate, in accordance with embodiments of the present invention.

FIG. 2 illustrates a side sectional view of a heat spreading substrate 200, in accordance with embodiments of the present invention. FIG. 2 illustrates the plane of faces 110B, 120B, 130B, 140B and 150B. It is to be appreciated that the width of layers 110, 120, 130, 140 and 150 as illustrated in FIG. 2 corresponds to the thickness of these layers as illustrated in FIG. 1. For example, FIG. 2 illustrates heat spreading substrates 100 of FIG. 1 rotated 90 degrees and viewed face on. Heat spreading substrate 100 optionally may have been cut along or parallel to the plane of edge cut 104, as illustrated in FIG. 1. Such a cut would decrease the height of layers 110, 120, 130, 140 and 150 as illustrated in FIG. 2, in comparison to their width as illustrated in FIG. 1. For example, in the perspective of FIG. 2, the heat spreading substrate 100 is wider than it is tall. For example, the sum of the widths of faces 110B, 120B, 130B and optional faces 140B and 150B is greater than the height of such faces. It is to be appreciated that faces 110B, 120B, 130B, 140B and 150B are substantially co-planar. It is to be further appreciated that faces resulting from a face cut 102 (FIG. 1) will also be substantially co-planar, regardless of the angle of face cut 102 with respect to the edges 110C-150C.

In accordance with embodiments of the present invention, edge cut 104 may be made such that the distance from edges 110C-150C is less than the height of the stack of layers 110-150.

Heat spreading substrate 200 comprises a heat spreading substrate 100. In addition, heat spreading substrate 200 comprises an optional electrical contact layer 210 applied to the "top" (in the perspective of FIG. 2) of conductive layers 110 and 150. Electrical contact layer 210 may comprise, for example, Gold (Au) and may be deposited via platting, sputtering or other well known techniques. Electrical contact layer(s) 210 may be of different thickness, materials and/or shape between layers 110 and 150, in accordance with embodiments of the present invention.

Electrical contact layer(s) 210 may provide a low electrical resistance connection between conductive layers 110, 150 and thermally enhanced electrical traces, e.g., device leads, contacts and/or wire bonds (not shown).

Heat spreading substrate 200 additionally comprises an optional thermally conductive pad 220 placed on top of heat spreader bar 130. Thermally conductive pad 220 may have a different size and shape than, and may be thicker or thinner, than electrical contact layer(s) 210.

Heat spreading substrate 200 further comprises an optional insulating adhesive tape 230, applied to the bottom of heat spreading substrate 100. Insulating adhesive tape 230 may prevent shoring between terminals, e.g., conductive terminals 110 and 150.

Figure 3A:
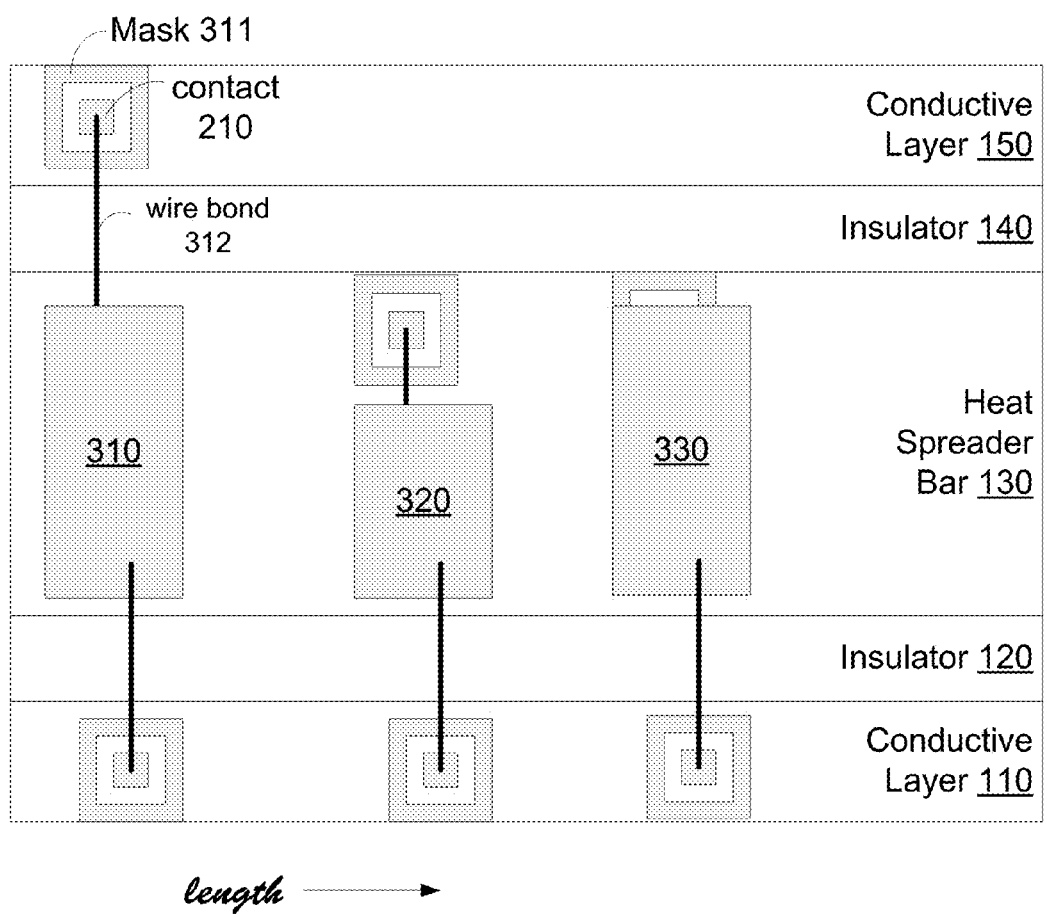
FIGS. 3A and 3B illustrate electronic assemblies, in accordance with embodiments of the present invention.

FIG. 3A illustrates an electronic assembly 300, in accordance with embodiments of the present invention. Electronic assembly 300 comprises a plurality of electronic devices, 310, 320, 330, that are mounted on heat spreading substrate 200, in accordance with embodiments of the present invention. Electronic device 310 is wire bonded, via wire bond 312 from the device to contact 210 of conductive layer 150. It is to be appreciated that a wire bond may be made to any suitable surface, including sides and/or bottom, of an electronic device, e.g., 310, 320, 330. Mask 311, e.g., a pattern of solder mask, may be formed around contact 210 to prevent electrical shorts and to aid in thermal distribution. Electronic device 310 is also wire bonded to conductive layer 110.

Electronic device 320 is wire bonded to conductive layer 110 and to heat spreader bar 130, in accordance with embodiments of the present invention. In this embodiment, heat spreader bar 130 is electrically conductive. In addition, optional insulator 140 and optional conductive layer 150 may not be present.

Electronic device 330 illustrates a hybrid bonding, in accordance with embodiments of the present invention. In this embodiment, heat spreader bar 130 is electrically conductive. Electronic device 330 is wire bonded to conductive layer 110. However, electronic device 330 is surface mounted to heat spreader bar 130.

It is to be appreciated that a plurality of electronic devices, e.g., 310, 320, 330 may be coupled to heat spreading substrate 200, in accordance with embodiments of the present invention. For example, there may be many instances of electronic devices 310, 320, and/or 330 mounted along a length of heat spreading substrate 200, in accordance with embodiments of the present invention. Further, such devices may receive power and/or other signals through heat spreading substrate 200, in accordance with embodiments of the present invention. For example, conductive layer 110 may be coupled to a power supply potential, and may couple such voltage to devices 310, 320 and 330. It is to be appreciated that other types of electrical signals may be coupled to an electronic device in a similar fashion. Similarly, conductive layer 150 may be coupled to a ground reference, and conduct such reference to electronic device 310, while heat spreader bar 130 may conduct a similar ground reference to electronic devices 320 and/or 330.

In accordance with other embodiments of the present invention, a single electronic device, mounted on heat spreading substrate 200 may be cut or singulated from a plurality of such devices mounted along the length of heat spreading substrate 200, for example via sawing or cutting, e.g., along face cut 102 of FIG. 1.

Figure 3B:
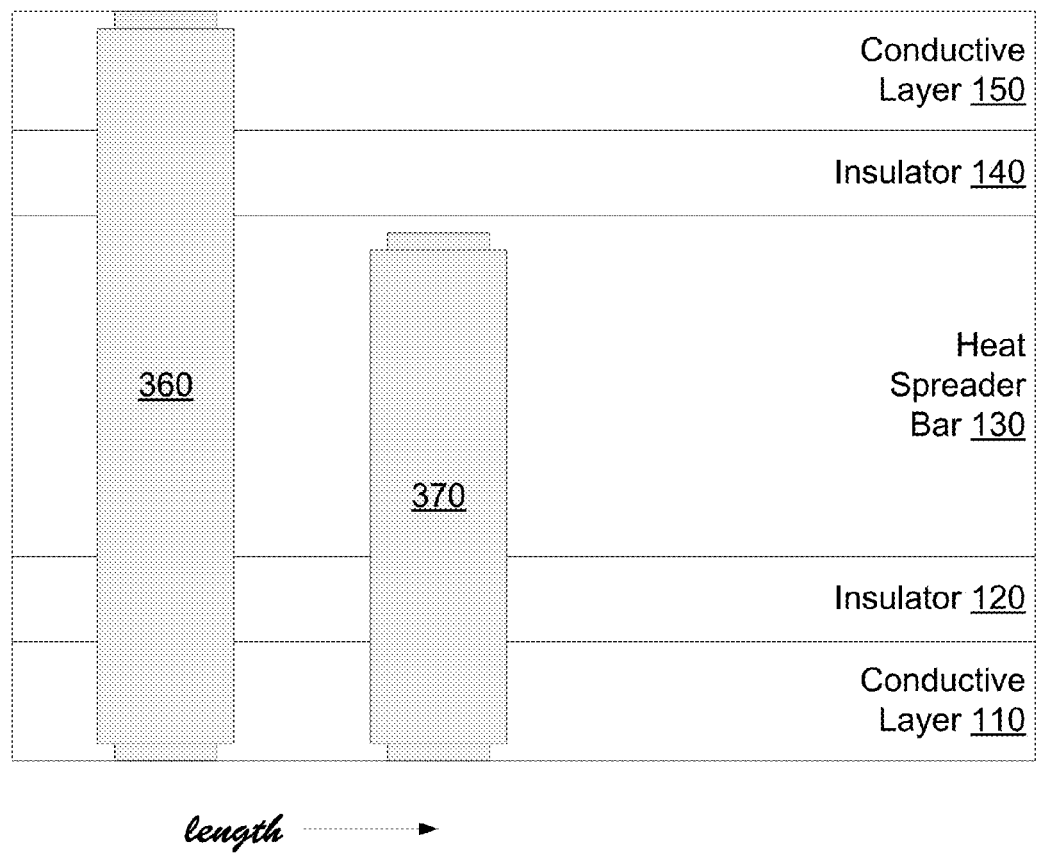

FIG. 3B illustrates an electronic assembly 350, in accordance with embodiments of the present invention. Electronic assembly 350 comprises a plurality of electronic devices, 360, 370, that are surface mounted on heat spreading substrate 200, in accordance with embodiments of the present invention. Electronic device 360 is in electrical contact with conductive layer 110 and conductive layer 150. A plurality of electronic devices may be surface mounted to heat spreading substrate 200, in accordance with embodiments of the present invention. It is to be appreciated that the size and/or shape of features such as solder masks, thermally conductive pad 220, and/or contact 210 may be different and/or omitted for a surface-mount embodiment in comparison with a wire-bond embodiment.

Electronic device 370 is mounted to conductive layer 110 and to heat spreader bar 130, in accordance with embodiments of the present invention. In this embodiment, heat spreader bar 130 is electrically conductive. In addition, optional insulator 140 and optional conductive layer 150 may not be present.

Embodiments in accordance with the present invention are well suited to a variety of electronic devices, e.g., electronic devices 310, 320, 330, 360 and/or 370. For example, such electronic devices may comprise light emitting diodes (LED), radio frequency (RF) devices, power semiconductors and the like.

It is to be appreciated that a plurality of electronic devices, e.g., multiple instances of electronic devices 360 and/or 370, may be mounted along a length of heat spreading substrate 200, in accordance with embodiments of the present invention. Further, such devices may receive power and/or other signals through heat spreading substrate 200, in accordance with embodiments of the present invention. For example, conductive layer 110 may be coupled to a power supply potential, and may couple such voltage to electronic devices 360, 370. It is to be appreciated that other types of electrical signals may be coupled to an electronic device in a similar fashion. Similarly, conductive layer 150 may be coupled to a ground reference, and conduct such reference to electronic device 360, while heat spreader bar 130 may conduct a similar ground reference to electronic device 370.

In accordance with other embodiments of the present invention, a single electronic device, mounted on heat spreading substrate 200 may be cut or singulated from a plurality of such devices mounted along the length of heat spreading substrate 200, for example via sawing or cutting, e.g., along face cut 102 of FIG. 1.

Figure 4A:
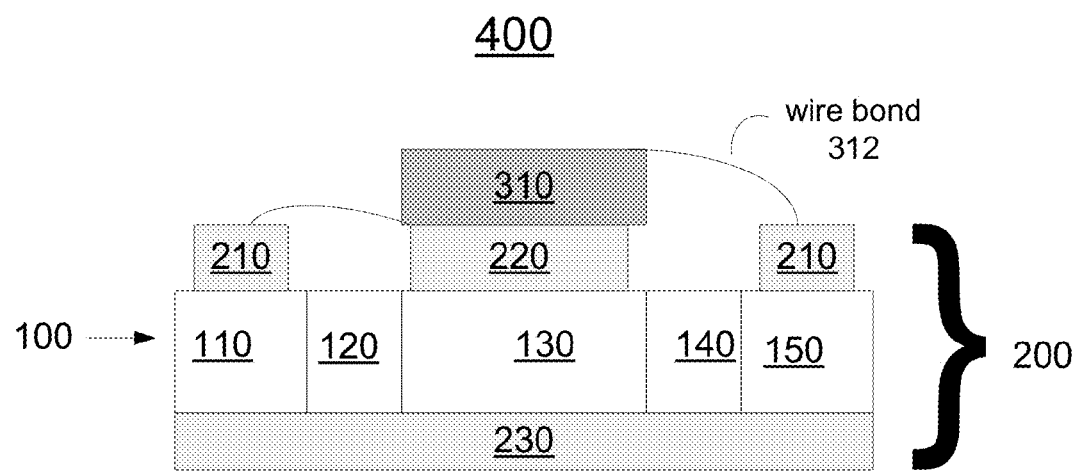
FIGS. 4A, 4B, 4C and 4D illustrate electronic assemblies, in accordance with embodiments of the present invention.

FIG. 4A illustrates an electronic assembly 400, in accordance with embodiments of the present invention. FIG. 4A is a side sectional view in the same perspective as FIG. 2, for example, from the perspective of section A, as indicated in FIG. 1. FIG. 4A illustrates an electronic device 310 mounted and wire bonded to heat spreading substrate 200. For example, a wire bond 312 functionally couples electronic device 310 to conductive layer 150 via contact 210. It is appreciated that a plurality of electronic devices, e.g., electronic devices 310 and 320 (FIG. 3) may be mounted and wire bonded to a heat spreading substrate, for example, heat spreading substrate 200. Such additional devices are above and below the plane of FIG. 4A, and are not illustrated therein.

Figure 4B:
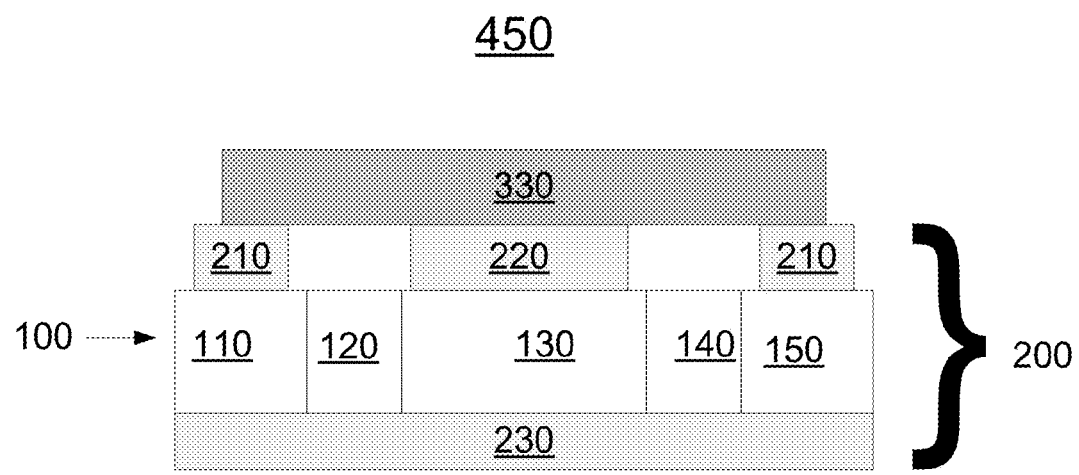

FIG. 4B illustrates an electronic assembly 450, in accordance with embodiments of the present invention. FIG. 4B is a side sectional view in the same perspective as FIGS. 2 and 4A, for example, from the perspective of section A, as indicated in FIG. 1. FIG. 4B illustrates an electronic device 330 surface mounted to heat spreading substrate 200. For example, contacts, e.g., solder bumps or controlled chip collapse connections (C4), of an electronic device 330 make electrical contact with contacts 210 and are thus coupled to conductive layers 150 and 110. Generally, the contacts of electronic device 330 will be soldered to contacts 210, but this is not required.

In accordance with alternative embodiments of the present invention, some contacts of an electronic device may be functionally coupled to heat spreading substrate 100 via surface mount methods, while other contacts of the same electronic device may be functionally coupled to heat spreading substrate 100 via wire bond techniques. For example, a contact on the bottom of electronic device 330 (FIG. 3A) may be functionally coupled to heat spreading substrate 100 via a surface mount connection, while a contact on the top of electronic device 330 may be functionally coupled to heat spreading substrate 100 via a wire bond connection. It is to be appreciated that light emitting diodes frequently have electrical terminals at opposite ends of their layer stack. Embodiments in accordance with the present invention are well suited to such applications.

Figure 4C:
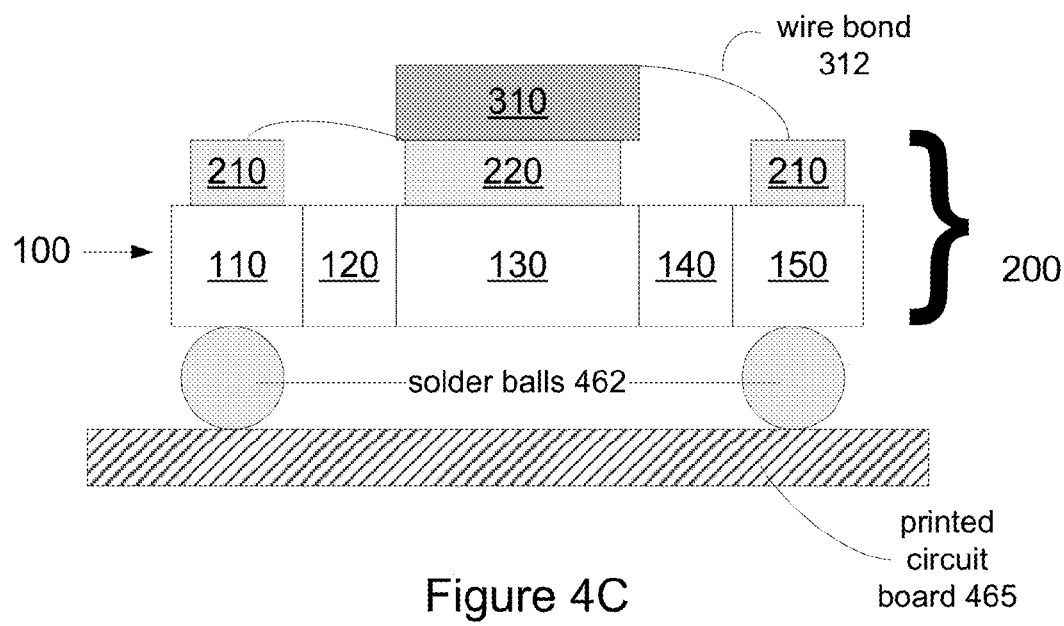

FIG. 4C illustrates an electronic assembly 460, in accordance with embodiments of the present invention. In FIG. 4C, solder balls 462 have been attached to the underside of conductive layers 110 and 150, as illustrated. In this manner, electronic assembly 460 may be surface mounted to a next higher electronic assembly, e.g., printed circuit board 465.

Figure 4D:
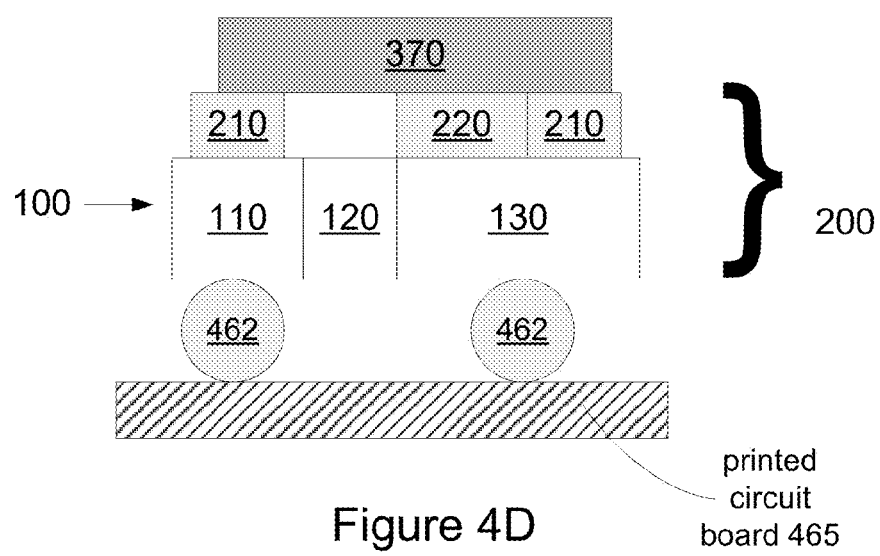

FIG. 4D illustrates an electronic assembly 480, in accordance with embodiments of the present invention. In FIG. 4D, solder balls 462 have been attached to the underside of conductive layer 110 and thermally conductive layer 130, as illustrated. In this embodiment, heat spreader bar 130 is electrically conductive. In addition, optional insulator 140 and optional conductive layer 150 may not be present. In this manner, electronic assembly 480 may be surface mounted to a next higher electronic assembly, e.g., printed circuit board 465.

In this novel manner, heat generated from electronic devices, e.g., 310, 320, 330 (FIG. 3), 360 and/or 370 (FIG. 3B) is efficiently and cost effectively conducted through thermally conductive pad 220, to heat spreader bar 130 and to any additional heat sinking structures, e.g., printed circuit board 465 (FIG. 4C). For example, heat flows "down" in the perspective of FIGS. 4A through 4D. In addition, heat spreading substrate 200 may also conduct electrical signals, e.g., voltage and ground, to electronic devices 310, 320, 330, 360 and/or 370.

FIG. 5 illustrates a method 500, in accordance with embodiments of the present invention. In 510 a sheet or strip of conductive material, e.g., Aluminum, is laid down. For example, conductive layer 110 (FIG. 1) is laid down.

In optional 515, a sheet or strip of insulating material, e.g., insulator 120 (FIG. 1), is placed on the strip of conductive material. The layer of insulating material may comprise an adhesive. In 520, a sheet or strip of highly thermally conductive material, e.g., heat spreader bar 140 (FIG. 1), is placed on the layer of insulating material. The layer of insulating material may provide mechanical bonding, e.g., adhesion, to the highly thermally conductive material.

In optional 525, a sheet or strip of insulating material, e.g., insulating layer 140 (FIG. 1), is placed on the highly thermally conductive material, e.g., heat spreader bar 140 (FIG. 1). In optional 530, a sheet or strip of conductive material, e.g., conductive layer 150 (FIG. 1), is placed on the layer of insulating material, e.g., insulating layer 140 (FIG. 1).

The thicknesses (in the perspective of FIG. 1) of the various layers should be determined by the application of the heat spreading substrate and the material properties. For example, the thickness of the highly thermally conductive material may be approximately the width of an (subsequently) attached electronic device. For example, with reference to FIG. 3A, the width of heat spreading bar 130 may be approximately the width of electronic device 310.

Similarly, the conductive sheets or strips, e.g., conductive layers 110, 150 (FIG. 3) should be wide enough to accommodate contact 210, mask 311 and a wire-bonding process. In addition, the length of conductive layers 110, 150 may influence the width, in order to achieve a suitable electrical resistance, e.g., in an application placing a plurality of electronic devices on a heat spreading substrate 200 (FIG. 3).

Referring once again to FIG. 5, in optional 535, the stack of layers 110-150 (FIG. 1) is sliced substantially parallel to the long axis of the layers, e.g., substantially parallel to the plane of edge cut 104 (FIG. 1), to produce a desired thickness of a heat spreading substrate 100, as illustrated in FIG. 2. Mechanical properties of the various materials and the heat spreading substrate 100 as a whole primarily determine the thickness of heat spreading substrate 100. Electrical resistance of conductive layers 110, 150 may also influence the thickness of heat spreading substrate 100.

In optional 540, an electrical contact layer, e.g., electrical contact layer 210 (FIG. 2), is applied to the "top" (in the perspective of FIG. 2) of the conductive layers, e.g., conductive layers 110 and 150 (FIG. 2). In optional 545, a thermally conductive pad, e.g., thermally conductive pad 220 (FIG. 2) is placed on top of the thermally conductive layer, e.g., heat spreader bar 130 (FIG. 2).

In optional 550, an insulating adhesive tape, e.g., insulating adhesive tape 230 (FIG. 2), may be applied to the bottom of the stack of materials, e.g., heat spreading substrate 100 (FIG. 2).

In optional 555, a plurality of electronic devices are mounted to a heat spreading substrate, e.g., using wire bonding and/or surface mounting techniques, for example as illustrated in FIGS. 3A and 3B. In optional 560, solder balls are attached to the underside of some or all conductive layers, e.g., as illustrated in FIGS. 4C and 4D, to facilitate surface mounting to a next higher electronic assembly.

In optional 599, individual electronic devices mounted to the heat spreading substrate are singulated by making a plurality of cuts substantially parallel to the plane of face cut 102 (FIG. 1). It is appreciated that the singulating cuts need not be exactly parallel to the plane of face cut 102, e.g., such cuts need not be exactly parallel to faces 110B-150B, nor exactly perpendicular to edges 110C-150C, as shown in FIG. 1. A variety of angles, e.g., +/−45 degrees with respect to the plane of face cut 102, for the singulating cuts are well suited to embodiments in accordance with the present invention. It is to be appreciated that the faces resulting from such cuts will be co-planar even if the singulating cuts are not exactly parallel to faces 110B-150B, nor exactly perpendicular to edges 110C-150C.

In accordance with embodiments of the present invention, a plurality of electronic devices may be assembled onto a heat spreading substrate, as illustrated in FIGS. 3A, 3B, 4A and 4B. These assemblies are commonly referred to in terms of the electronic device. For example, the combination of one or more light emitting diodes, e.g., 310, 320 (FIG. 3) assembled onto a heat spreading substrate may be referred to itself as a light emitting diode.

Figure 6:
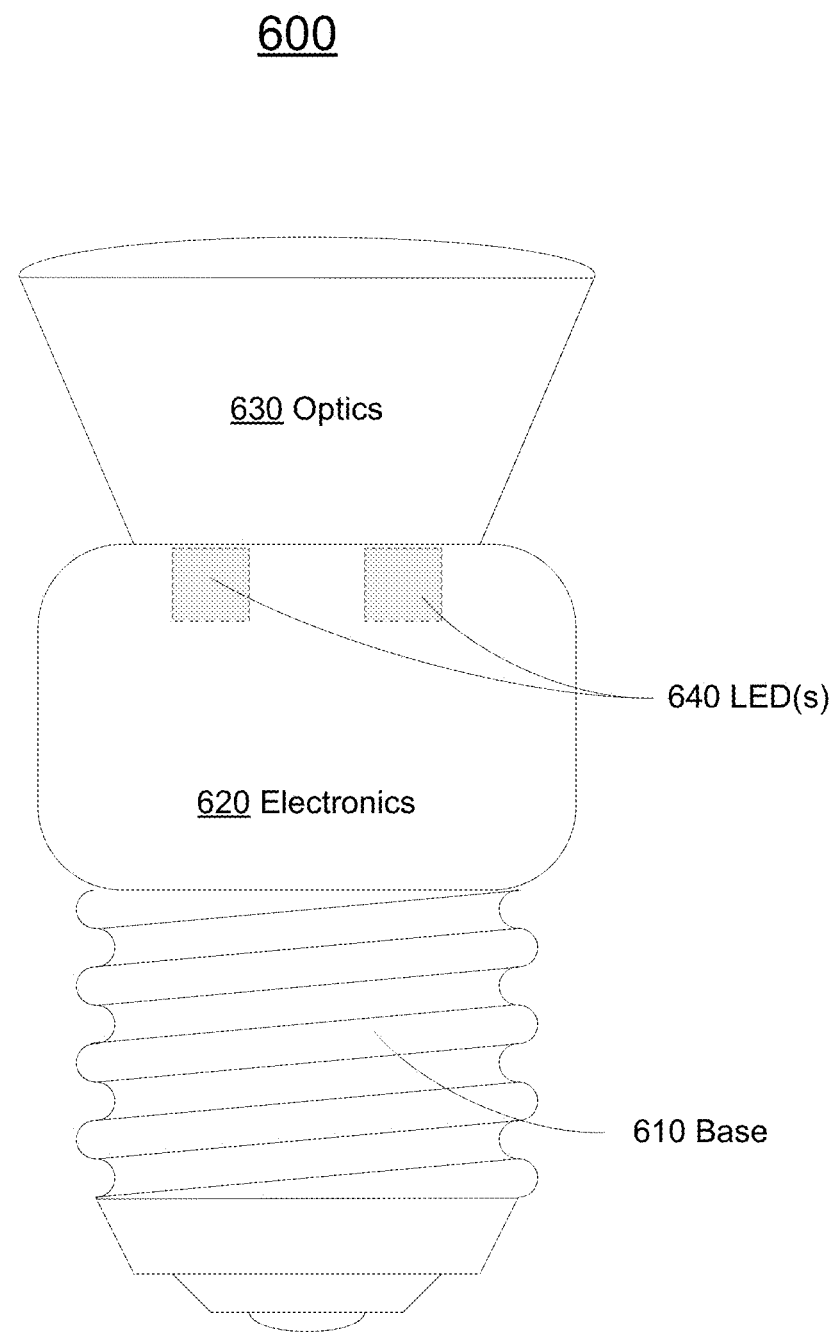
FIG. 6 illustrates an example of an application of a light emitting diode, in accordance with embodiments of the present invention.

FIG. 6 illustrates an example of an application of a light emitting diode, in accordance with embodiments of the present invention. Light source 600 is well suited to a variety of lighting applications, including domestic, industrial and landscape lighting. Light source 600 is also well suited to stage or theatrical lighting. Light source 600 comprises a base 610. As illustrated, base 610 is an Edison type base. It is appreciated that embodiments in accordance with the present invention are well suited to other types of bases, including, for example, GU, bayonet, bipin, stage pin, wedge or other type of bases.

Light source 600 additionally comprises a body portion 620 that houses power conditioning electronics (not shown) that convert 110V AC input electrical power (or 220 V AC, or other selected input electrical power) to electrical power suitable for driving a plurality of light emitting diode devices 640. Body portion 620 may also comprise, or couple to, optional heat sink features (not shown).

Light source 600 additionally comprises optional optics 630. Optics 630 comprise diffusers and/or lenses for focusing and/or diffusing light from the plurality of light emitting diode devices 640 into a desired pattern.

Light source 600 comprises a plurality of light emitting diode devices (LEDs) 640. Individual LEDs of plurality of light emitting diode devices 640 may correspond to assemblies previously described herein. For example, plurality of light emitting diode devices 640 may include instances of electronic devices 310, 320 and/or 330 (FIG. 3A). It is appreciated that not all instances of plurality of light emitting diode devices 640 need be identical.

It is to be further appreciated that plurality of light emitting diode devices 640 may include a single heat spreading substrate comprising multiple light emitting devices. For example, a single instance of plurality of light emitting diode devices 640 may comprise a plurality of individual, different, LED devices mounted on a common heat spreading substrate. For example, a first electronic device may be a blue light emitting diode. A second electronic device may be a green light emitting diode. A third electronic device may be a red light emitting diode. The three electronic devices may be arranged on a heat spreading substrate such that the light from such three colors may be combined to produce a variety of spectral colors. For example, a plurality of light emitting diode devices may comprise multiple LEDs in combination to produce a "white" light output.

In accordance with embodiments of the present invention, plurality of light emitting diode devices 640 may include additional electronics associated with the LED devices. In one exemplary embodiment, such additional electronics may comprise circuits to implement a white balance among tri-color LEDs.

Figure 7:
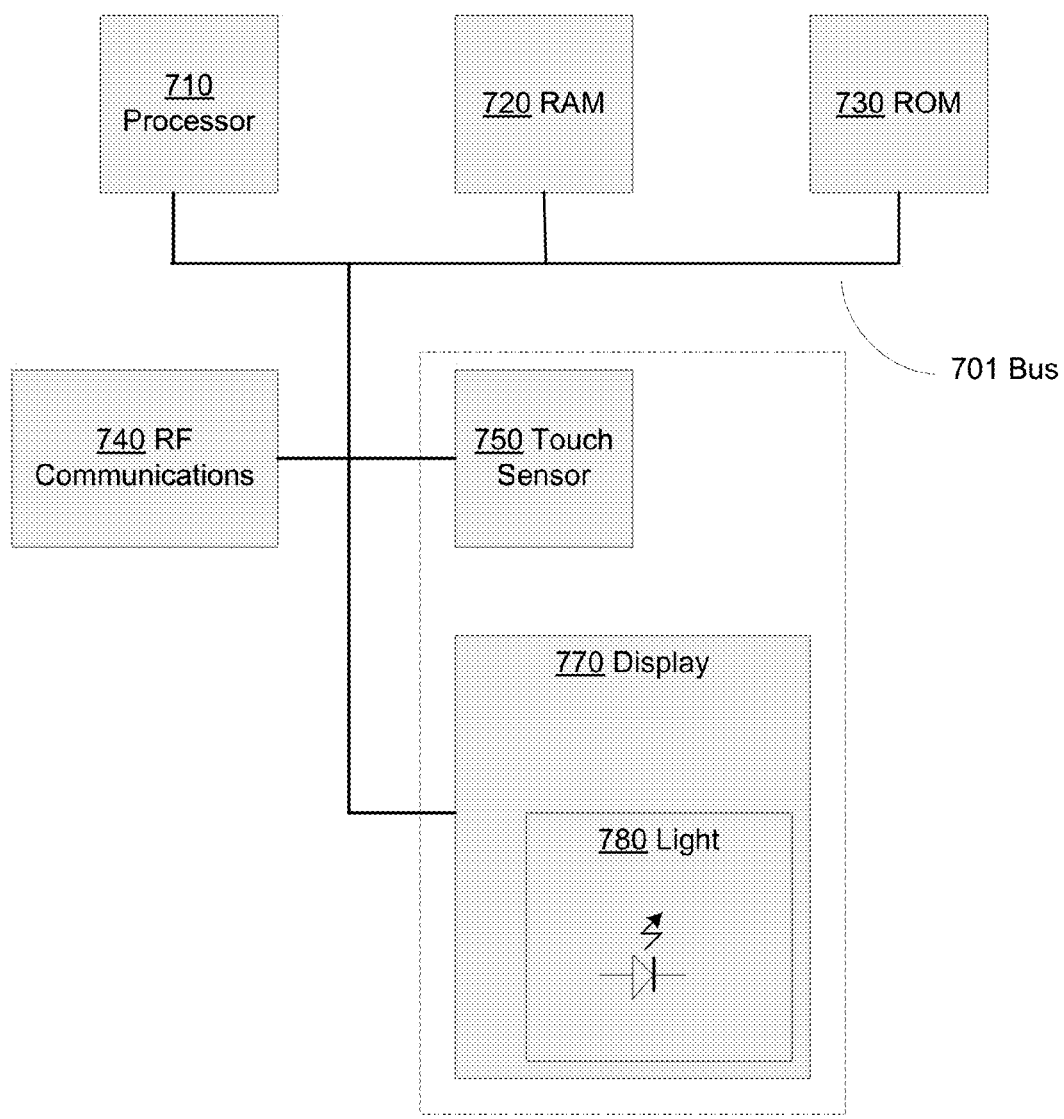
FIG. 7 illustrates an exemplary portable computer system, in accordance with embodiments of the present invention.

FIG. 7 illustrates an exemplary portable computer system 700, in accordance with embodiments of the present invention. Portable computer system 700 may be a mobile phone or smart phone, email device, tablet, laptop or netbook computer, personal digital assistant or the like. A bus 701 functionally couples the various functional blocks of system 700. Bus 701 may comprise multiple busses, and any such bus may be a single conductor.

Portable computer system 700 comprises a processor 710. Processor 710 may be any type of processor for executing software, and may comprise multiple distinct processors, including central processing units and graphical processing units. Processor 710 may also be a multi-core device. Processor 710 generally controls the operation of portable computer system 700, and may operate a graphical user interface. For example, processor 710 accepts input, e.g., from touch sensor 750 and/or optional RF communications 740, and may produce output, e.g., to display 770 and/or RF communications 740. Processor 710 may access random access memory (RAM) 720 for programs and/or data, and may also access read only memory (ROM) for programs and/or data.

Portable computer system 700 optionally comprises a radio-frequency (RF) communications subsystem 740. RF communications system 740 is well suited to operate on a variety of radio communication protocols, including, for example, data and/or telephony networks, e.g., Bluetooth, WiFi, TDMA, CDMA, GSM, AMPS and the like. RF communications system 740, if present, operates to communicate voice, image and/or data to and from portable communication system 700.

Portable computer system 700 comprises a touch sensor subsystem 750. Touch sensor 750 may operate as a resistive or capacitive device, and generally functions to accept input to system 700 in the form of a touch, e.g., from a finger and/or a stylus. Touch sensor 750 is generally strongly associated with a display device. For example, a user of system 700 may perceive touching a "screen" rather than a separate touch sensor.

Portable computer system 700 also comprises a display device 770. Display 770 may be any suitable technology, including, for example, an STN or TFT LCD display device Display 770 functions to output images and/or alpha-numeric information from system 700.

Portable computer system 700 further includes a light 780 to illuminate display 770. For example, most LCD devices do not directly produce light; rather such devices filter light from another source, e.g., light 780. Alternatively, light 780 may provide supplemental illumination when ambient light is insufficient for viewing display 770.

In accordance with embodiments of the present invention, light 780 comprises a plurality of light emitting diodes. Individual LEDs of plurality of light emitting diode devices 780 may correspond to assemblies previously described herein. For example, plurality of light emitting diode devices 780 may include multiple electronic devices, e.g., electronic devices 310, 320, and/or 330 (FIG. 3A), electronic devices 360 and/or 370 (FIG. 3B). It is appreciated that not all instances of plurality of light emitting diode devices 780 need be identical.

Light 780 may illuminate display 770 from the front and/or the back and/or the sides of display 770, and may be referred to as a front light, back light and/or side light. Light from light 780 may be coupled to the display by a diffuser in front of or behind display 770.

Figure 8A:
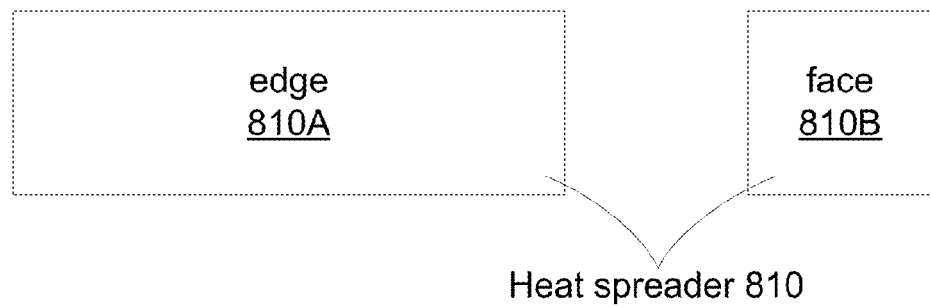
FIGS. 8A, 8B, 8C and 8D illustrate a method of manufacturing a heat spreading substrate, in accordance with embodiments of the present invention.

FIGS. 8A-8D illustrate a method of manufacturing a heat spreading substrate 800, in accordance with embodiments of the present invention. FIG. 8A illustrates a solid heat spreading bar 810, in accordance with embodiments of the present invention. Heat spreading bar 810 may be a regular solid, e.g., a rectangular cuboid, although other regular solids, e.g., a parallelepiped, are well suited to embodiments in accordance with the present invention. Heat spreading bar 810 comprises two surfaces (not shown), first edge 810A and first face 810B. A second edge and second face are not shown.

Heat spreading bar 810 comprises an electrical insulating material having a high thermal conductivity. Heat spreader bar 810 is further characterized as having a low coefficient of thermal expansion.

In some embodiments, heat spreader bar 810 should be characterized as having a high thermal conductivity, e.g., having a thermal conductivity greater than that of sapphire ($\alpha$-$Al_2O_3$), 32 or 35 $W \cdot m^{-1} \cdot K^{-1}$, depending on the orientation. Heat spreader bar 810 may be further characterized as having a low coefficient of thermal expansion, e.g., having a coefficient of thermal expansion ($\alpha$) less than that of Aluminum, 23 $10^{-6}/°$ C.

In some embodiments, heat spreader bar 810 is further characterized as having a low linear coefficient of thermal expansion ($\alpha$), while in other embodiments, heat spreader bar 810 is characterized as having a low volumetric coefficient of thermal expansion, e.g., having a volumetric coefficient of thermal expansion ($\beta$) less than that of Aluminum, 69 $10^{-6}/°$ C. Still other embodiments may be characterized as having low linear and low volumetric coefficients of thermal expansion for heat spreader bar 810. Exemplary materials for heat spreader bar 810 include ceramics and Silicon carbide.

Figure 8B:
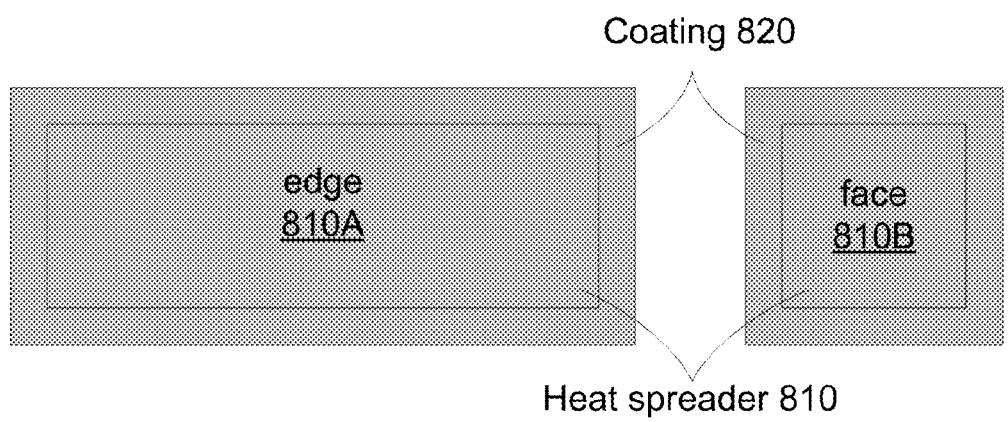

FIG. 8B illustrates heat spreading bar 810 with a conductive coating 820 applied, in accordance with embodiments of the present invention. Coating 820 may be applied by plating, deposition, dipping, painting and other well known methods of applying a conductive coating to an insulator. In accordance with some embodiments of the present invention, coating 820 may not be applied to the surfaces, e.g., top and bottom, of heat spreading bar 810.

Figure 8C:
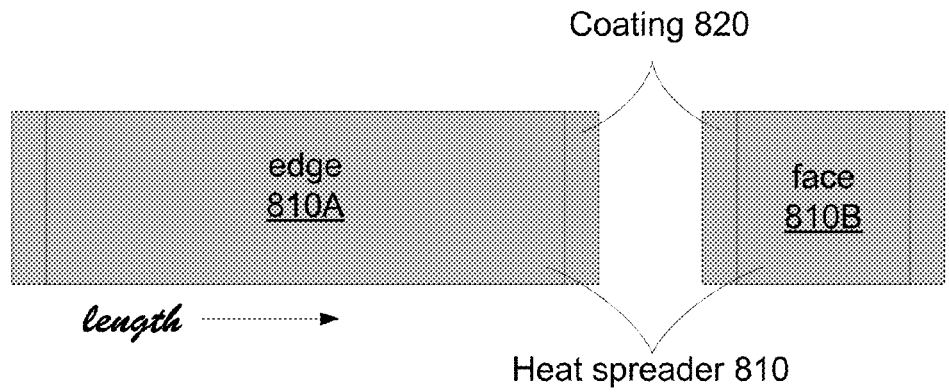

FIG. 8C illustrates heat spreading bar 810 after portions of coating 820 have been removed, in accordance with embodiments of the present invention. As illustrated, portions of coating 820 have been removed from the top and bottom surfaces of heat spreading bar 810. Any suitable method of partial removal of coating 820 may be utilized, including, for example, mechanical methods, e.g., cutting, sawing and/or polishing, and chemical methods, e.g., dissolving and/or chemical-mechanical polishing (CMP).

In accordance with embodiments of the present invention, portions of coating 820 on the edges of heat spreading bar 810, e.g., edge 810A and/or the faces of heat spreading bar 810, e.g., face 810B, may remain at this stage of processing. For example, those portions may be removed at a later stage of processing.

Figure 8D:
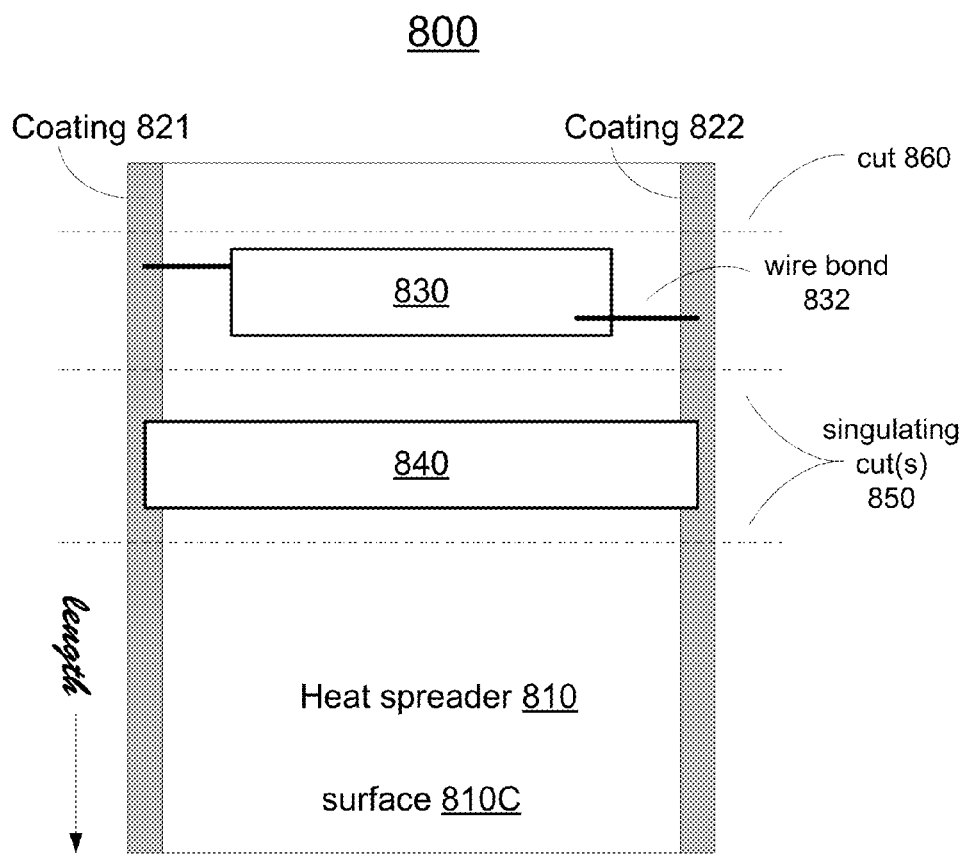

FIG. 8D illustrates a top view of heat spreading bar 810 after portions of coating 820 have been removed, in accordance with embodiments of the present invention.

FIG. 8D also illustrates the physical separation of the remaining portions of coating 820. FIG. 8D further illustrates cut 860, similar to singulating cuts 850, further described below, and substantially parallel to a face of heat spreading bar 810, may be made to remove any portions of coating 820 remaining on faces of heat spreading bar 810, electrically separating portions of coating 820 on the edges of heat spreading bar 810, forming electrically separated coating 821 and coating 822, in accordance with other embodiments of the present invention. It is appreciated that portions of coating 820 on faces of heat spreading bar 810 may be removed at other stages of processing, for example, as described with respect to FIG. 8C.

FIG. 8D further illustrates a plurality of electronic devices 830, 840, functionally mounted to head spreading substrate 800, in accordance with embodiments of the present invention. Electronic device 830 is wire bonded to head spreading substrate 800. For example, bond wires 832 couple electronic device 830 to the conductors formed by coating 820. Electronic device 830 is surface mounted to head spreading substrate 800. For example, contacts of electronic device 840 are coupled, e.g., soldered, to the conductors formed by coating 820. In accordance with embodiments of the present invention, coating 820 should have sufficient width (in the perspective of FIG. 8D) to attach wire bonds and/or surface mount contacts.

Embodiments in accordance with the present invention are well suited to a variety of electronic devices, e.g., electronic devices 830, 840. For example, such electronic devices may comprise light emitting diodes (LED), radio frequency (RF) devices, power semiconductors and the like.

It is to be appreciated that a plurality of electronic devices, e.g., multiple instances of electronic devices 830 and/or 840, may be mounted along a length of head spreading substrate 800, in accordance with embodiments of the present invention. Further, such devices may receive power and/or other signals through heat spreading substrate 800, in accordance with embodiments of the present invention. For example, coating 821 may be coupled to a power supply potential, and may couple such voltage to electronic devices 830, 840. It is to be appreciated that other types of electrical signals may be coupled to an electronic device in a similar fashion. Similarly, coating 822 may be coupled to a ground reference, and conduct such reference to electronic devices 830, 840.

In accordance with other embodiments of the present invention, a single electronic device, mounted on heat spreading substrate 800 may be cut or singulated from a plurality of such devices mounted along the length of heat spreading substrate 800, for example via sawing or cutting, e.g., along singulating cuts 850 of FIG. 8D.

Figure 9A:
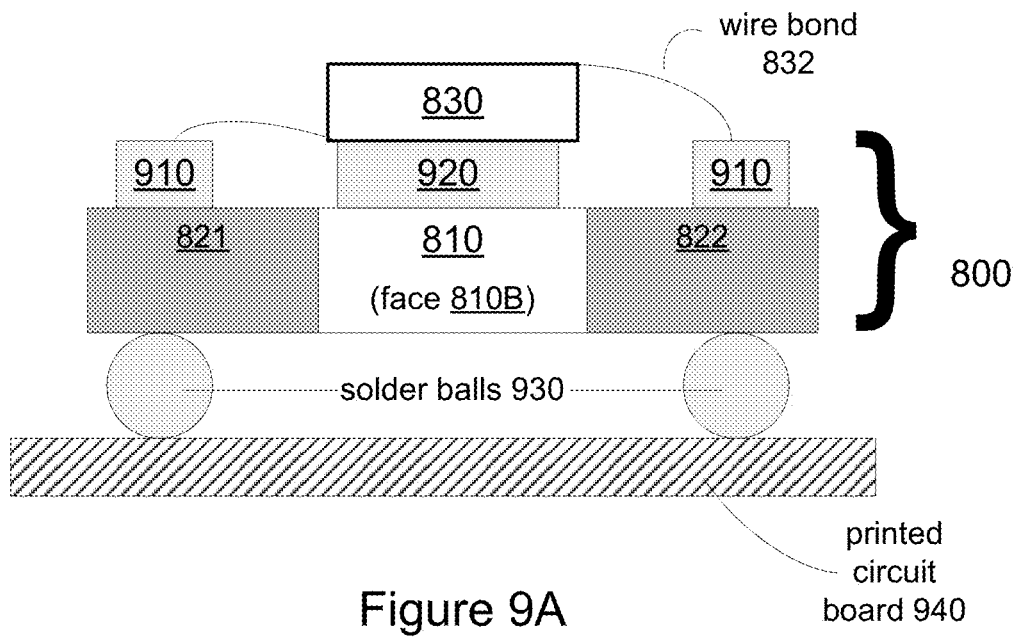
FIGS. 9A and 9B illustrate electronic assemblies, in accordance with embodiments of the present invention.

FIG. 9A illustrates an electronic assembly 900, in accordance with embodiments of the present invention. FIG. 9A is a side view of a face, e.g., face 810B, of heat spreading substrate 800. FIG. 9A illustrates an electronic device 830 mounted and wire bonded to heat spreading substrate 800. For example, a wire bond 832 functionally couples electronic device 830 to conductive coating 822 via optional contact 910. Optionally, a thermally conductive pad 920 may be utilized to improve heat conduction from electronic device 830 to heat spreading bar 810, in accordance with embodiments of the present invention. It is appreciated that a plurality of electronic devices, e.g., electronic devices 830 and 340 (FIG. 8D) may be mounted to a heat spreading substrate, for example, heat spreading substrate 800. Such additional devices are above and below the plane of FIG. 9A, and are not illustrated therein.

Figure 9B:
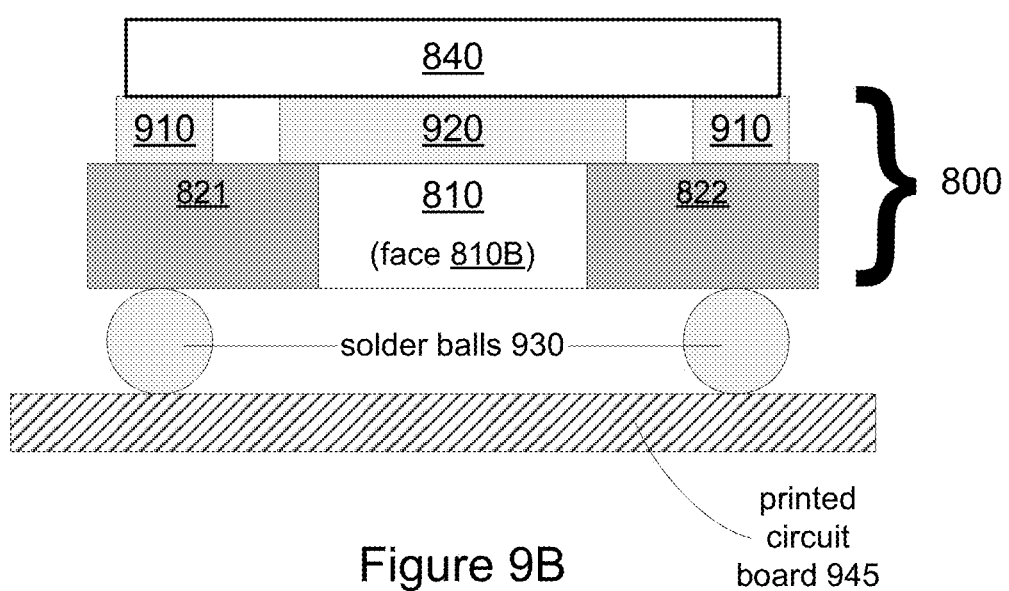

FIG. 9B illustrates an electronic assembly 950, in accordance with embodiments of the present invention. FIG. 9B is a side view of a face, e.g., face 810B), of heat spreading substrate 800. FIG. 9B illustrates an electronic device 840 surface mounted to heat spreading substrate 800. For example, contacts, e.g., solder bumps or controlled chip collapse connections (C4), of an electronic device 840 make electrical contact with contacts 910 and are thus coupled to conductive layers 821 and 822. Generally, the contacts of electronic device 840 will be soldered to contacts 910, but this is not required.

FIGS. 9A and 9B further illustrate electronic assemblies 900 and 950, respectively, surface mounted to a next higher electronic assembly, e.g., printed circuit boards 940 and 945, respectively, in accordance with embodiments of the present invention. In FIGS. 9A and 9B, solder balls 930 have been attached to the underside of conductive layers 821 and 822, as illustrated.

Figure 10A:
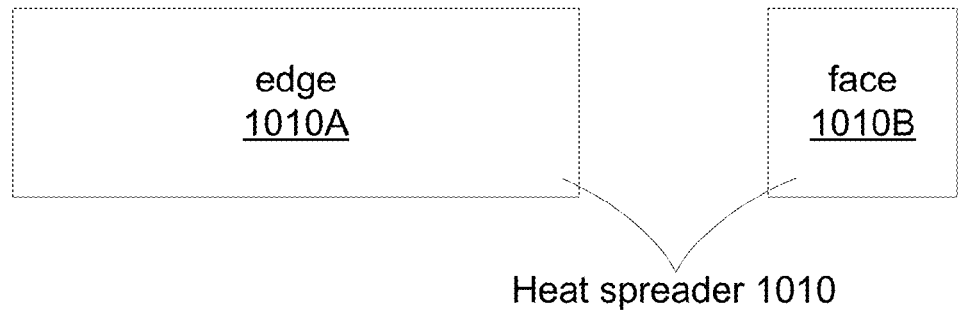
FIGS. 10A, 10B, 10C and 10D illustrate a method of manufacturing a heat spreading substrate, in accordance with embodiments of the present invention.

FIGS. 10A-10D illustrate a method of manufacturing a heat spreading substrate 1000, in accordance with embodiments of the present invention. FIG. 10A illustrates a solid heat spreading bar 1010, in accordance with embodiments of the present invention. Heat spreading bar 1010 may be a regular solid, e.g., a rectangular cuboid, although other regular solids, e.g., a parallelepiped, are well suited to embodiments in accordance with the present invention. Heat spreading bar 1010 comprises two surfaces (not shown), first edge 1010A and first face 1010B. A second edge and second face are not shown.

Heat spreading bar 1010 comprises an electrically conducting material having a high thermal conductivity, e.g., having a thermal conductivity greater than that of sapphire ($\alpha$-$Al_2O_3$), 32 or 35 $W \cdot m^{-1} \cdot K^{-1}$, depending on the orientation. Heat spreader bar 1010 may be further characterized as having a low coefficient of thermal expansion, e.g., having a coefficient of thermal expansion ($\alpha$) less than that of Aluminum, 23 $10^{-6}/°$ C. Exemplary materials forming heat spreading bar 1010 include Aluminum (Al), Copper (Cu), metal powders, particle filled materials, Silicon, metal-filled epoxy, composite materials and the like may also be used in the formation of conductive layer 1010.

In some embodiments, heat spreader bar 1010 is further characterized as having a low linear coefficient of thermal expansion ($\alpha$), while in other embodiments, heat spreader bar 1010 is characterized as having a low volumetric coefficient of thermal expansion, e.g., having a volumetric coefficient of thermal expansion ($\beta$) less than that of Aluminum, 69 $10^{-6}/°$ C. Still other embodiments may be characterized as having low linear and low volumetric coefficients of thermal expansion for heat spreader bar 1010.

Figure 10B:
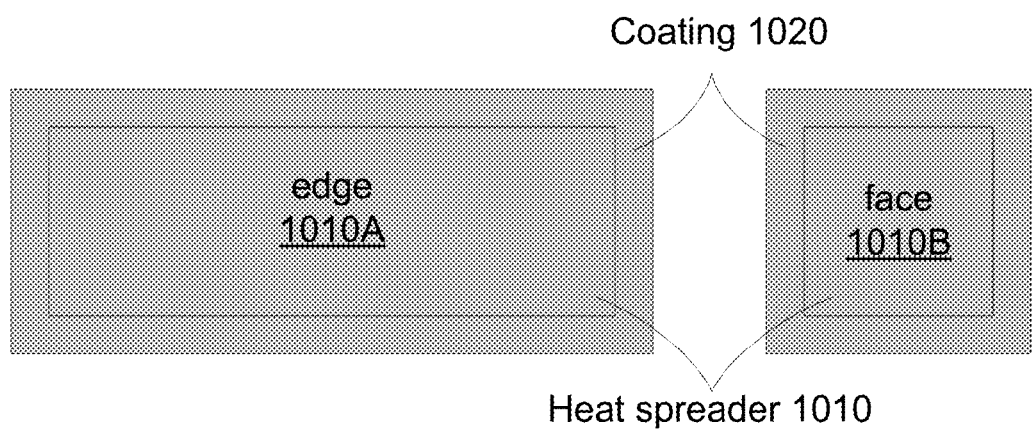

FIG. 10B illustrates heat spreading bar 1010 with an electrically insulating coating 1020 applied, in accordance with embodiments of the present invention. Coating 1020 may be applied by anodizing, plating, dipping, painting and other well known methods of applying or forming an electrically insulating coating on a conductor. Coating 1020 may comprise a polymer, for example. In accordance with some embodiments of the present invention, coating 1020 may not be applied to the surfaces, e.g., top and bottom, of heat spreading bar 1010.

Figure 10C:
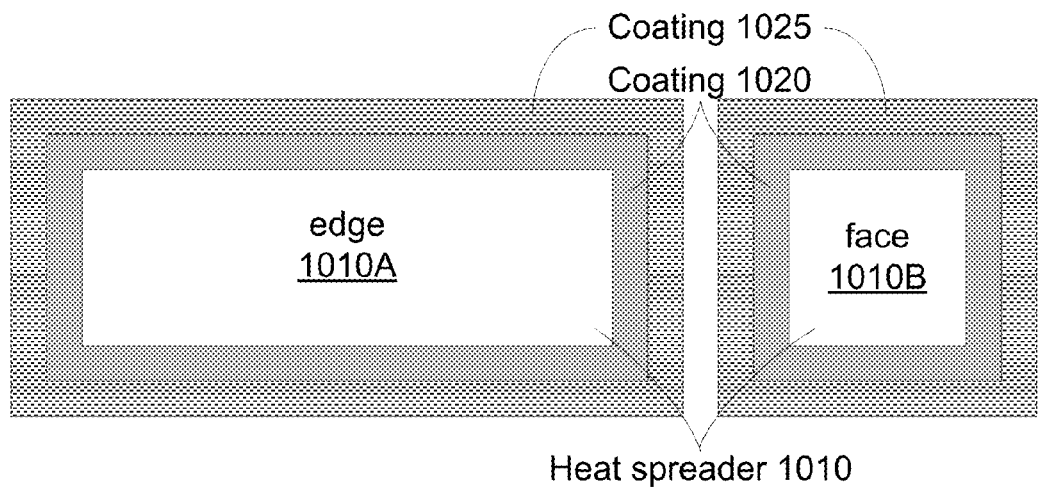

FIG. 10C illustrates heat spreading bar 1010 with a conductive coating 1025 applied over conductive coating 1020, in accordance with embodiments of the present invention. Coating 1025 may be applied by plating, dipping, painting and other well known methods of applying a conductive coating to an insulator. In accordance with some embodiments of the present invention, coating 1025 may not be applied to the surfaces, e.g., top and bottom, of heat spreading bar 1010. In some embodiments, a resist material may be optionally applied to the top and bottom of heat spreading bar 1010, prior to applying or forming coating 1020. Such an operation may aid in removal, or prevent adherence, of coating 1020 on the top and bottom of heat spreading bar 1010.

Figure 10D:
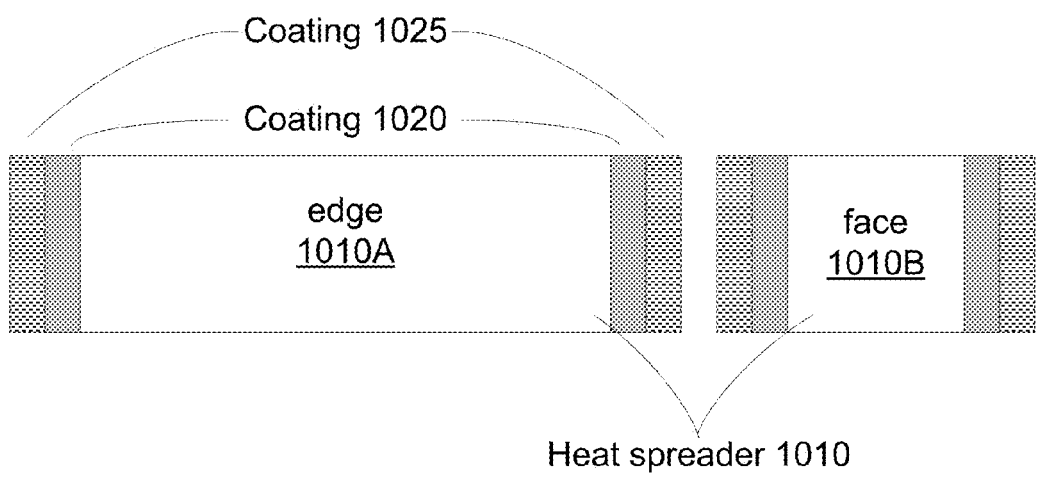

FIG. 10D illustrates heat spreading bar 1010 after portions of coating 1020 and portions of coating 1025 have been removed, in accordance with embodiments of the present invention. As illustrated, portions of coatings 1020 and 1025 have been removed from the top and bottom surfaces of heat spreading bar 1010. Portions of coatings 1025 and/or 1020 may also be removed from the faces of heat spreading bar 1010. Any suitable method of partial removal of coatings 1020 and 1025 may be utilized, including, for example, mechanical methods, e.g., cutting, sawing and/or polishing, and chemical methods, e.g., dissolving and/or chemical-mechanical polishing (CMP).

Figure 11:
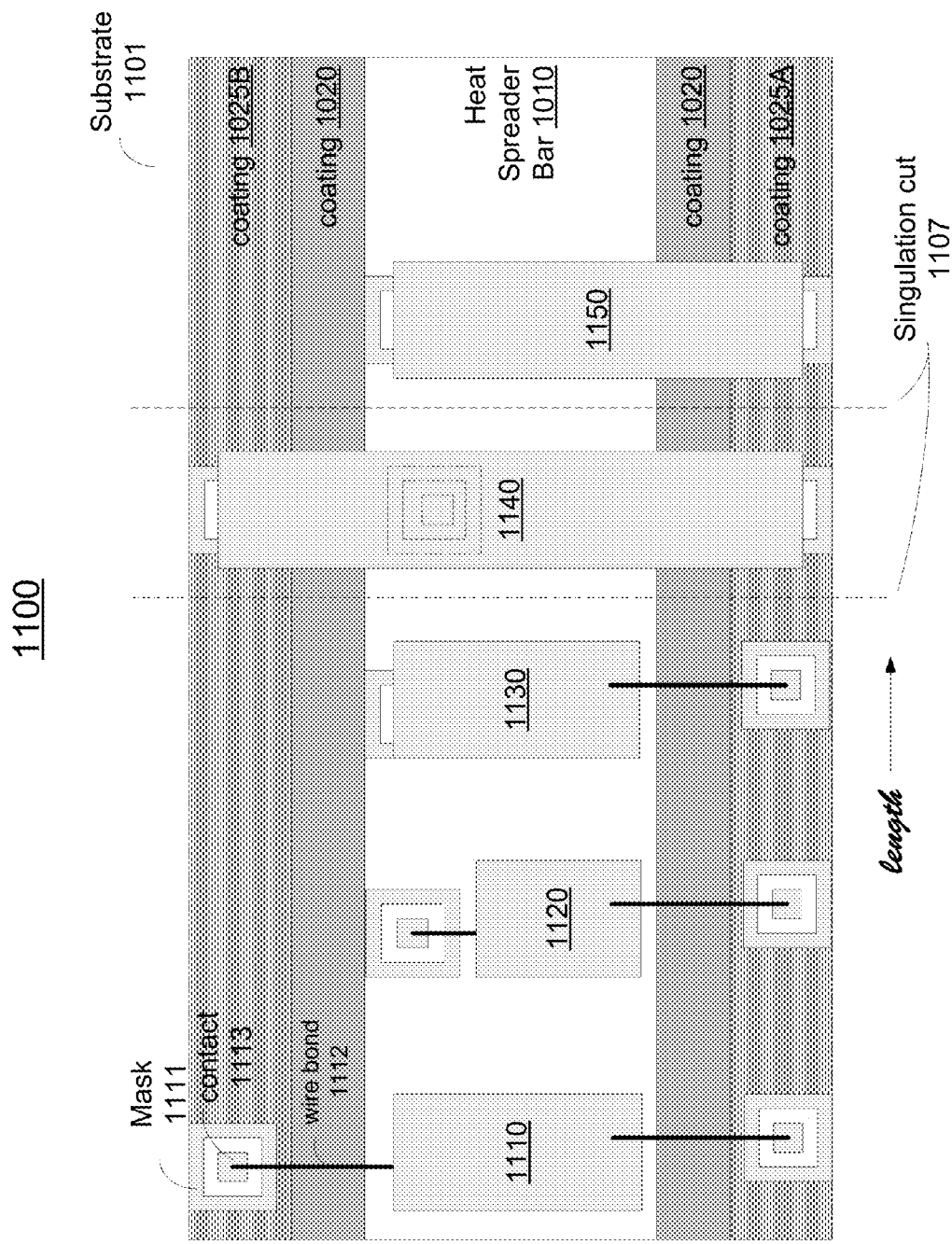
FIG. 11 illustrates an electronic assembly, in accordance with embodiments of the present invention.

FIG. 11 illustrates an electronic assembly 1100, in accordance with embodiments of the present invention. Electronic assembly 1100 comprises a plurality of electronic devices, 1110, 1120, 1130, 1140, 1150 that are mounted on heat spreading substrate 1101, in accordance with embodiments of the present invention. Heat spreading substrate 1101 comprises heat spreading bar 1010, coating 1020, and coatings 1025A and 1025B. Coatings 1025A and 1025B are formed by electrically isolating portions of coating 1025, as described with respect to FIG. 10D.

Electronic device 1110 is wire bonded, via wire bond 1112 from the device to contact 1113 of coating 1025B. It is to be appreciated that a wire bond may be made to any suitable surface, including sides and/or bottom, of an electronic device, e.g., 310, 320, 330. Mask 1111, e.g., a pattern of solder mask, may be formed around contact 1113 to prevent electrical shorts and to aid in thermal distribution. Electronic device 1110 is also wire bonded to coating 1025A.

Electronic device 1120 is wire bonded to coating 1025A and to heat spreading bar 1010, in accordance with embodiments of the present invention. Electronic device 1130 illustrates a hybrid bonding. Electronic device 1130 is wire bonded to coating 1025A and surface mounted to heat spreading bar 1010, in accordance with embodiments of the present invention.

Electronic device 1140 is surface mounted to coating 1025A and to coating 1025B, in accordance with embodiments of the present invention. Electronic device 1140 may also optionally comprise a surface mounted electrical connection to heat spreading bar 1010. In this manner, electronic device 1140 may receive three electrical signal coupled via heat spreading substrate 1101. Electronic device 1150 is surface mounted to coating 1025A and to heat spreading bar 1010, in accordance with embodiments of the present invention.

It is to be appreciated that a plurality of electronic devices, e.g., electronic devices 1110, 1120, 1130, 1140, 1150 may be coupled to heat spreading substrate 1101, in accordance with embodiments of the present invention. For example, there may be many instances of electronic devices 1110, 1120, 1130, 1140 and/or 1150 mounted along a length of heat spreading substrate 1101, in accordance with embodiments of the present invention. Further, such devices may receive power and/or other signals through heat spreading substrate 1101, in accordance with embodiments of the present invention. For example, coating 1025A may be coupled to a power supply potential, and may couple such voltage to devices 1110, 1120, 1130, 1140 and/or 1150. It is to be appreciated that other types of electrical signals may be coupled to an electronic device in a similar fashion. Similarly, conductive coating 1025B may be coupled to a ground reference, and conduct such reference to electronic devices 1110 and/or 1140, while heat spreader bar 1010 may conduct a similar ground reference to electronic devices 1120, 1130 and/or 1150. Further, coating 1025A, coating 1025B and heat spreading bar 1010 may conduct different signals and/or power supply voltages, in accordance with embodiments of the present invention.

In accordance with other embodiments of the present invention, a single electronic device, mounted on heat spreading substrate 1101 may be cut or singulated from a plurality of such devices mounted along the length of heat spreading substrate 1101, for example via sawing or cutting, e.g., along singulation cuts 1107 of FIG. 11.

It is to be appreciated that head spreading bar 1010 is electrically conductive in this embodiment. Accordingly, those portions of conductive coating 1025 and/or 1020 on one side (top or bottom, in the perspective of FIG. 11) may optionally be removed, in accordance with embodiments of the present invention. For example, electronic devices 1120, 1130 and/or 1150 may be mounted to heat spreading substrate even if coating 1025B and the top coating 1020 are not present.

Figure 12A:
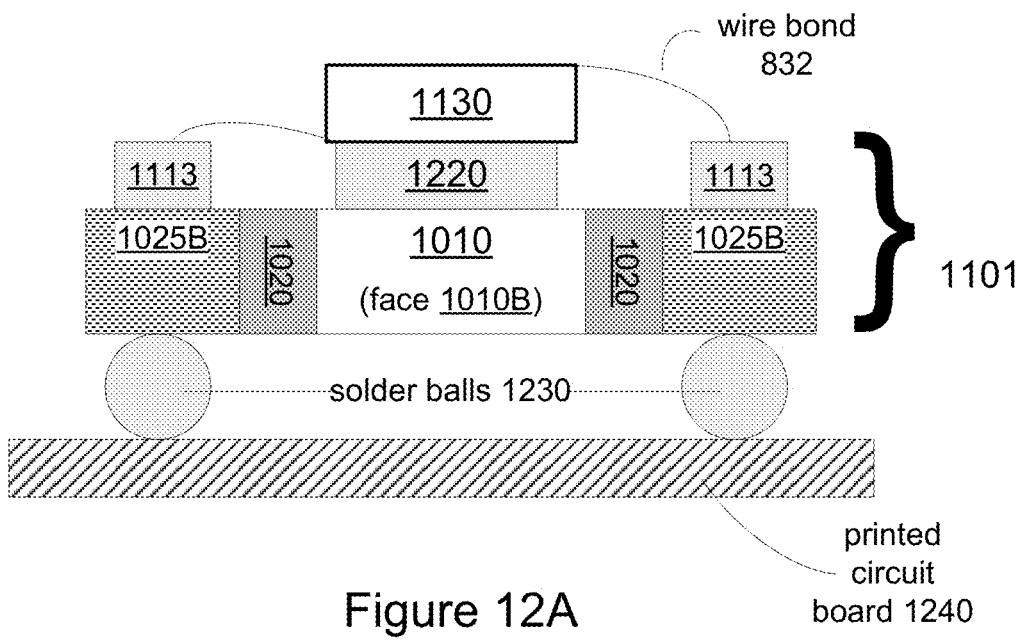
FIGS. 12A and 12B illustrate electronic assemblies, in accordance with embodiments of the present invention.

FIG. 12A illustrates an electronic assembly 1200, in accordance with embodiments of the present invention. FIG. 12A is a side view of a face, e.g., face 1010B, of heat spreading substrate 1101. FIG. 12A illustrates an electronic device 1130 mounted and wire bonded to heat spreading substrate 1101. For example, a wire bond 1122 functionally couples electronic device 1130 to coating via optional contact 1113. Optionally, a thermally conductive pad 1220 may be utilized to improve heat conduction from electronic device 1130 to heat spreading bar 1010, in accordance with embodiments of the present invention. It is appreciated that a plurality of electronic devices, e.g., electronic devices 110, 1120, 1130, 1140 and/or 1150 (FIG. 11A) may be mounted to a heat spreading substrate, for example, heat spreading substrate 1101. Such additional devices are above and below the plane of FIG. 12A, and are not illustrated therein.

Figure 12B:
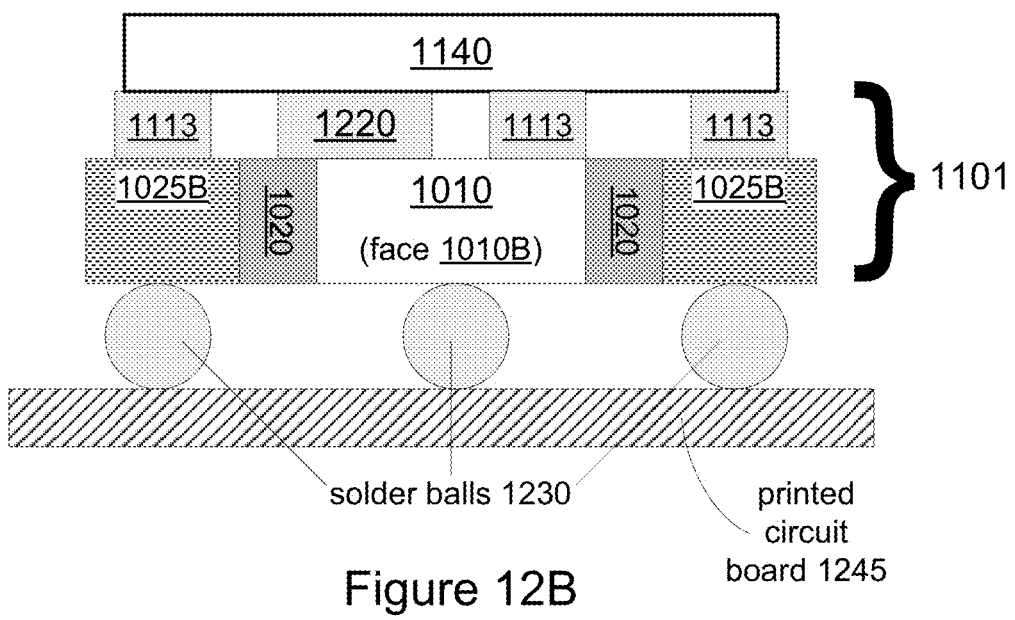

FIG. 12B illustrates an electronic assembly 1250, in accordance with embodiments of the present invention. FIG. 12B is a side view of a face, e.g., face 1010B, of heat spreading substrate 1101. FIG. 12B illustrates an electronic device 1140 surface mounted to heat spreading substrate 1101. For example, contacts, e.g., solder bumps or controlled chip collapse connections (C4), of an electronic device 1140 make electrical contact with contacts 1113 and are thus coupled to coatings 1025A and 1025B. Generally, the contacts of electronic device 1140 will be soldered to contacts 1113, but this is not required.

In accordance with embodiments of the present invention, electronic device 1140 may also comprise a surface mount electrical connection to head spreading bar 1010.

FIGS. 12A and 12B further illustrate electronic assemblies 1200 and 1250, respectively, surface mounted to a next higher electronic assembly, e.g., printed circuit boards 1240 and 1245, respectively, in accordance with embodiments of the present invention. In FIGS. 12A and 12B, solder balls 1230 have been attached to the underside of conductive coatings 1025A, 1025B and/or head spreading bar 1010, as illustrated.

Embodiments in accordance with the present invention provide systems and methods for heat spreading substrates. In addition, embodiments in accordance with the present invention provide systems and methods for heat spreading substrates comprising rolled materials. Further, embodiments in accordance with the present invention provide systems and methods for heat spreading substrates that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. An apparatus comprising:
 a thermally conductive, electrically insulating solid;
 a first electrically conductive coating mechanically coupled to a first edge of said solid;
 a second electrically conductive coating mechanically coupled to a second edge of said solid;
 wherein said first and said second electrically conductive coatings are electrically isolated from one another; and wherein faces of said first electrically conductive coating, said second electrically conductive coating and said solid are substantially coplanar.

2. The apparatus of claim 1 wherein the primary and secondary surfaces of said solid are free of electrically conductive materials.

3. The apparatus of claim 1 wherein said thermally conductive, electrically insulating solid is configured for mounting a body of an electronic device.

4. The apparatus of claim 1 wherein said first electrically conductive coating and said second electrically conductive coating are configured for conducting electrical signals to contacts of an electronic device.

5. The apparatus of claim 1 further comprising a plurality of electronic devices wire bonded to said first electrically conductive coating.

6. The apparatus of claim 1 further comprising a plurality of electronic devices surface mounted to said first electrically conductive coating.

7. The apparatus of claim 1 further comprising a light emitting diode.

8. The apparatus of claim 7 further comprising:
a base for coupling to an alternating current supply; and
electronics configured to convert said alternating current to electrical power suitable for driving said light emitting diode.

9. The apparatus of claim 8 further comprising at least two light emitting diodes mounted on the same said thermally conductive, electrically insulating solid.

10. The apparatus of claim 7 further comprising:
a processor for operating a graphical user interface;
a display for displaying said graphical user interface; and
wherein said light emitting diode is configured to illuminate said display.

11. The apparatus of claim 1 further comprising radio frequency circuitry.

12. The apparatus of claim 1 further comprising a power semiconductor device.

13. An apparatus comprising:
a thermally and electrically conducting solid;
a first insulating coating mechanically coupled to a first edge of said solid;
a first electrically conductive coating mechanically coupled to said first insulating coating;
a second insulating coating mechanically coupled to a second edge of said solid;
a second electrically conductive coating mechanically coupled to said second insulating coating;
wherein said first and said second electrically conductive coatings are electrically isolated from one another; and
wherein faces of said first and electrically conductive coatings, said first and second insulating coatings and said solid are substantially co-planar.

14. The apparatus of claim 13 wherein primary and secondary surfaces of said thermally and electrically conducting solid are exposed.

15. The apparatus of claim 13 wherein said first electrically conductive coating and said second electrically conductive coating are configured for making electrical contact with contacts of an electronic device.

16. The apparatus of claim 13 wherein said thermally and electrically conducting solid is configured for conducting electrical signals to said contacts of an electronic device.

17. The apparatus of claim 13 further comprising a plurality of electronic devices having electronic device bodies.

18. The apparatus of claim 17 wherein said plurality of electronic devices are surface mounted to said first electrically conductive coating.

19. The apparatus of claim 17 comprising a wire bond coupling and a surface mount coupling.

20. The apparatus of claim 17 comprising a surface mount coupling to said thermally and electrically conducting regular solid.

21. The apparatus of claim 17 wherein said plurality of electronic devices comprise a light emitting diode.

22. The apparatus of claim 21 further comprising: a base for coupling to an alternating current supply; and
electronics configured to convert said alternating current to electrical power suitable for driving said light emitting diode.

23. The apparatus of claim 21 further comprising:
a processor for operating a graphical user interface;
a display for displaying said graphical user interface; and
wherein said light emitting diode is configured to illuminate said display.

24. The apparatus of claim 17 wherein said plurality of electronic devices comprise radio frequency circuitry.

25. The apparatus of claim 17 wherein said plurality of electronic devices comprise a power semiconductor device.

* * * * *